United States Patent
Shanbhag et al.

(10) Patent No.: US 7,298,226 B2
(45) Date of Patent: Nov. 20, 2007

(54) NOISE TOLERANT VOLTAGE CONTROLLED OSCILLATOR

(75) Inventors: Naresh Shanbhag, Champaign, IL (US); Hyeon Min Bae, Champaign, IL (US); Jinki Park, Plano, TX (US); Paul Suppiah, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/420,195

(22) Filed: May 24, 2006

(65) Prior Publication Data

US 2007/0018742 A1  Jan. 25, 2007

Related U.S. Application Data

(60) Provisional application No. 60/684,195, filed on May 24, 2005.

(51) Int. Cl.
*H03B 1/00* (2006.01)

(52) U.S. Cl. .................. 331/177 V; 331/175; 331/185; 331/36 C

(58) Field of Classification Search ............ 331/177 V, 331/36 C, 185, 175
See application file for complete search history.

(56) References Cited

U.S. PATENT DOCUMENTS 6,724,273 B1 * 4/2004 Jones ..................... 331/177 V

* cited by examiner

*Primary Examiner*—Arnold Kinkead
(74) *Attorney, Agent, or Firm*—McDonnell Boehnen Hulbert & Berghoff LLP

(57) ABSTRACT

A noise tolerant voltage controlled oscillator is described. The voltage controlled oscillator include a varactor element as part of an LC tank circuit. The varactor element is biased by a bias signal and a bias-dependent control signal. The bias-dependent control signal tunes the LC tank circuit. Because the control signal is bias-dependent, noise and other deleterious influences do not cause the varactor element to deviate in capacitance. Instead, the bias-dependent control signal is a tuning signal that is centered around the bias signal, which allows the varactor element to provide a constant capacitance in the event of a varying bias signal.

31 Claims, 5 Drawing Sheets

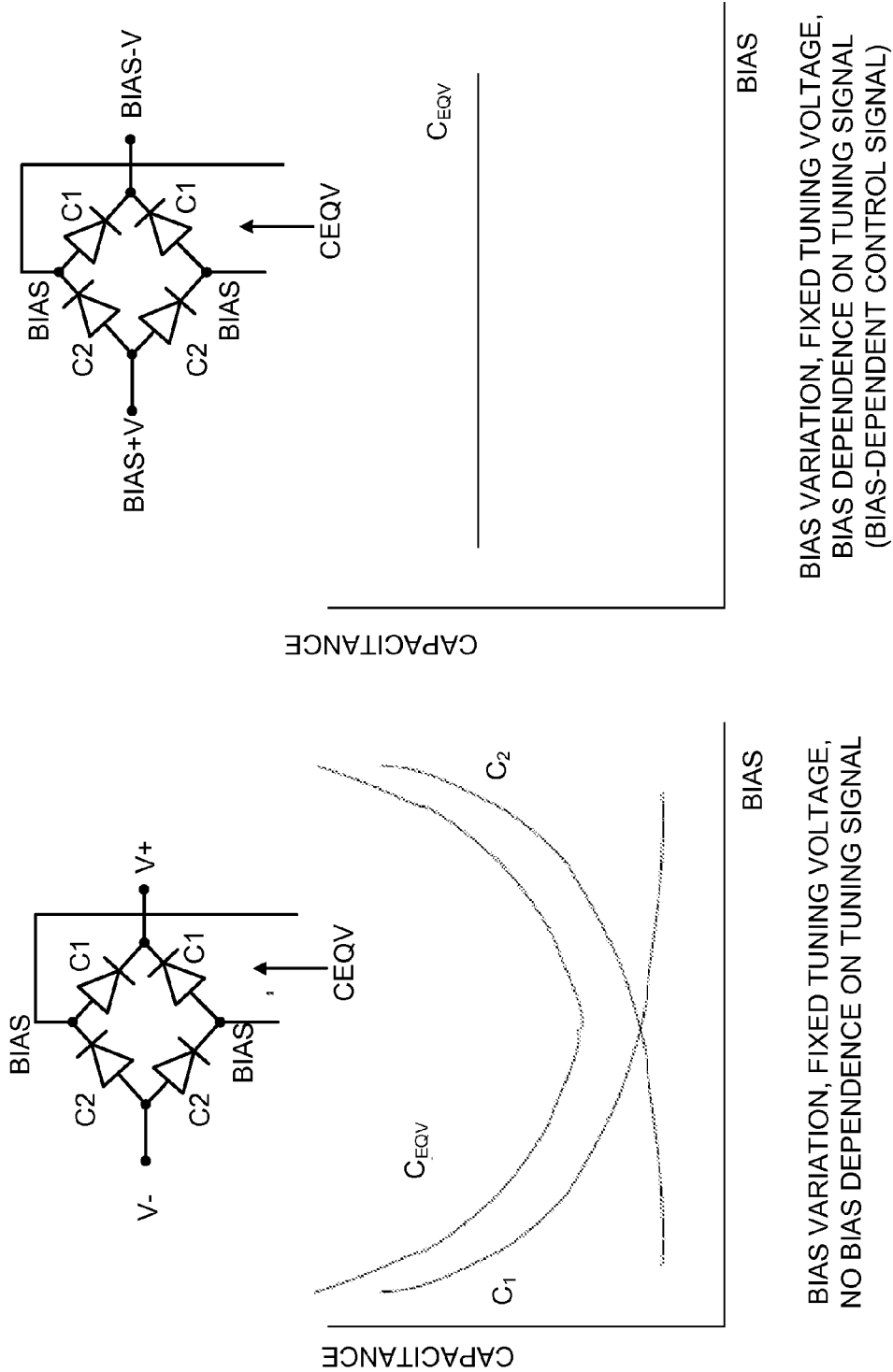

NOISE TOLERANT VOLTAGE CONTROLLED OSCILLATOR

CROSS-REFERENCE TO RELATED APPLICATIONS

The present application claims priority to U.S. Provisional Application No. 60/684195, entitled "Clock Data Recovery Architecture", filed May 24, 2005, which is hereby incorporated by reference herein in its entirety.

FIELD OF THE INVENTION

The present invention relates generally to a voltage controlled oscillator, and more particularly, to a voltage controlled oscillator that comprises a variable capacitive element.

BACKGROUND

Many circuits today use voltage controlled oscillators (VCOs) to generate a reliable periodic signal. For example, phase locked loops (PLLs) typically include a VCO for duty cycle correction, phase/delay compensation, and/or frequency multiplication. Although VCOs come in various configurations (e.g., a ring oscillator, a crystal oscillator, or an LC tank circuit), a VCO generally receives a voltage tuning signal indicative of a desired periodic output signal. The applied voltage signal may be varied to adjust, or tune, the frequency of the output signal. For example, using such a voltage signal, a PLL may tune a VCO until the VCO outputs a desired waveform. If, at any point of operation, the waveform needs to be adjusted or corrected, the PLL will adjust the magnitude of the voltage signal to tune the VCO.

Unfortunately, because VCOs are located in proximity to other circuitry, often sharing the same substrate and biasing, VCOs are subjected to noise (e.g., common-mode voltage shifts). Moreover, environmental factors, such as temperature and electromagnetic radiation, may also produce noise. Such noise reduces the performance of a VCO and may increase operational overhead. For example, common-mode voltage noise within a VCO may increase the capacitance of circuit elements that the VCO comprises. When the VCO receives a tuning signal, the increased capacitance may increase the amount of time it takes the VCO to produce the correct waveform. Such a lag in time may likewise reduce the performance of circuits and devices that use the VCO. Therefore, it is desirable to provide a VCO that may be subjected to noise without comprising performance.

SUMMARY

An apparatus and a method of operation of a noise tolerant VCO are presented. In one example, a VCO includes a varactor element having two input nodes and two output nodes. The output nodes of the varactor element provide an effective capacitance, and are intercoupled with an inductive element. The varactor element, for example, may comprise four varactor diodes, which are arranged to receive an input signal.

Together the inductive and varactor elements act as a differential tank circuit (which may be viewed as two tank circuits), producing a desired LC constant of the VCO. To properly bias the varactor element, a bias circuit supplies a bias signal to the output nodes of the varactor element. The bias circuit, for example, may be a bandgap reference circuit.

To tune the VCO, the input nodes of the varactor element are coupled to receive a bias-dependent control signal, which is a combination of a tuning signal and the bias signal. In a preferred embodiment, the common mode, or average, of the bias-dependent signal is substantially equal to the bias signal. The bias-dependent control signal adjusts the capacitance value of the varactor element. Accordingly, the LC constant may be altered, producing a periodic output signal at a desired frequency. Advantageously, because the bias-dependent control signal is a combination of the tuning signal and the bias signal, any noise, including a common-mode voltage shift, is mitigated.

In one example, the bias-dependent control signal may be produced by a tuning circuit. The tuning circuit may include a differential amplifier, and the tuning and bias-dependent control signals may likewise be differential signals. The differential amplifier, for example, may further mitigate common-mode voltages that may potentially occur across the tuning signal. To increase tuning efficiency, or speed, the differential amplifier of the tuning circuit may also be coupled to the varactor element via a low-impedance driver, such as emitter-follower circuitry.

In an additional example, the VCO may include a pair of resistive elements, a pair of capacitive elements, and a negative resistive component, all of which are intercoupled with the output nodes of the varactor element. The resistive elements may be used to distribute the bias signal to the output nodes of the varactor element. For example, the bias signal may be applied to a common node where both of the resistive elements are coupled together. In addition, the bias circuit may be coupled to the common node via a low-impedance driver such as emitter-follower circuitry.

The capacitive elements, on the other hand, may be used to promote the coupling of the varactor element to the negative resistive component. In general, the negative resistance component provides energy to the VCO, to sustain the output waveform. In one example, the negative resistance may include a differential pair, which provides a negative transconductance across the output nodes of the varactor element.

In an alternative example, a method of operating a VCO is described. In the examplary method, a VCO receives a tuning signal and a bias signal. The VCO combines the tuning and bias signal into a bias-dependent control signal and provides the bias-dependent control signal to the control nodes of a variable capacitance. The variable capacitance may be located within an oscillator circuit, for example. The VCO also uses the bias signal to bias two output nodes of the variable capacitance. Because the bias-dependent control signal includes a bias signal component, the VCO has an increased tolerance to noise. For example, when the bias signal is influenced by common-mode voltage noise, the bias-dependent control signal is likewise influenced. Consequently, the capacitance value of the variable capacitance is prevented from spiking or increasing.

In another example, the tuning signal and the bias-dependent control signals may be differential signals. Furthermore, the bias-dependent control signal may be viewed as the tuning signal centered around the bias signal.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIG. 3A is a graph of capacitance vs. a bias signal without bias-dependent control signaling;

FIG. 3B is a graph of capacitance vs. a bias signal with bias-dependent control signaling.

DETAILED DESCRIPTION

Figure 1:
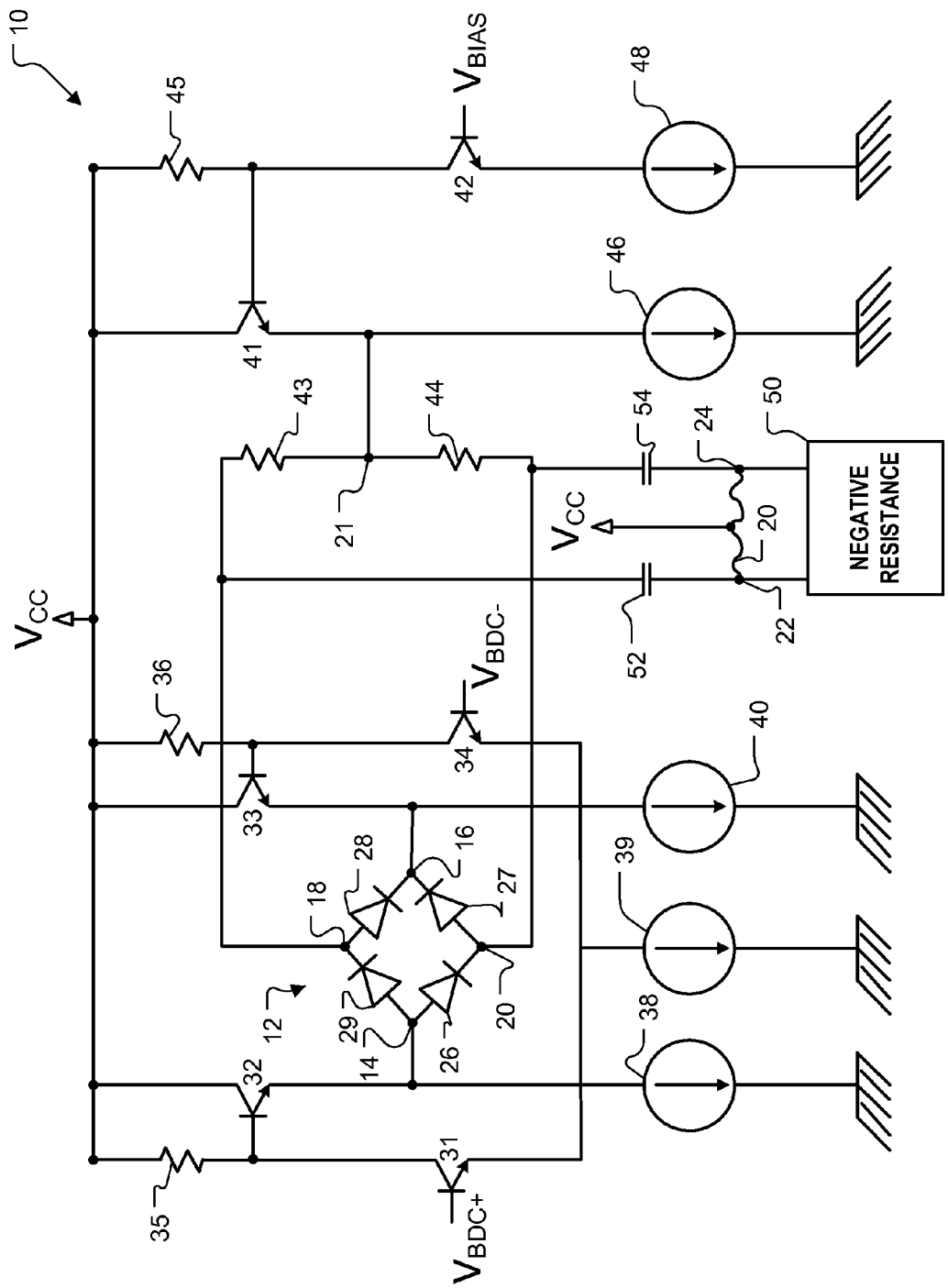
FIG. 1 is a schematic diagram of a VCO, according to an example.

Turning now to the figures, FIG. 1 is a schematic diagram of VCO 10. The VCO 10 includes a varactor element 12 that includes input nodes 14, 16 and output nodes 18, 20. The output nodes 18, 20 receive a bias signal ($V_{BIAS}$). The input nodes receive a bias-dependent control signal ($V_{BDC+}$, $V_{BDC-}$), which is a combination of the bias signal and a tuning signal. In the example of FIG. 1, the bias-dependent control signal is a differential signal. In an alternative example, the bias-dependent control signal may be single ended. Generally speaking, however, differential signaling may be beneficial as such signaling mitigates common-mode voltage influences. Moreover, the bias and bias-dependent control signals, although described as voltage signals, may be current signals.

In general, the varactor element 12 serves as a variable capacitor. The VCO 10, however, may incorporate other types of variable capacitors and the varactor element 12 should not be viewed as limiting. The VCO 10 also includes an inductor 20, which is intercoupled with the varactor element 12. The inductor 20 and the varactor element 12 together form two tank circuits that establish a frequency of a periodic output signal generated across the inductor 20 (nodes 22, 24). The varactor element 12 is symmetric about a common node 21 and the inductor 20 is symmetric about an applied voltage Vcc.

The capacitance value of the varactor element 12 may be adjusted by applying the bias-dependent control signal at the input nodes 14, 16. The varactor element 12 includes varactor diodes 26-29. The diodes 26-29 each comprise a PN junction that is operated under a reverse bias voltage. By increasing the amount of reverse bias across each PN junction, the depletion zone associated with each of the diodes 26-29 increases, reducing the capacitance of the diodes 26-29. Conversely, decreasing the reverse bias ultimately increases the capacitance of the diodes 26-29. The bias-dependent control signal directly determines the amount of reverse bias applied to the diodes 26-29, establishing the capacitance of the tank circuits and therefore establishing the frequency of the periodic output signal.

To communicate the bias-dependent control signal to the varactor element 12, the VCO 10 includes bipolar junction transistors (BJTs) 31-34 and resistors 35, 36. The BJTs 31, 34 are coupled to a tail current source 39. The BJTs 32, 33, on the other hand, are respectively coupled to tail current sources 38, 40.

FIG. 1 shows the BJTs 31-32 and the resistor 35 arranged in a common-emitter amplifier and an emitter-follower configuration. Similarly, the BJTs 33-34 and the resistor 36 are also in a common-emitter/emitter-follower configuration. The emitter-follower configurations, although not necessary, shift a frequency pole at each of the input nodes 14, 16. For example, if the tail current source 38 has a current of approximately 1 mA, the input resistance is approximately equal to 0.026 Ohm (1 mA/$V_t$). Overall, minimizing the input resistance increases the tuning speed of the VCO 10. In some examples, however, other methods of applying the bias-dependent control signal are possible.

To communicate the bias signal to the output nodes 18, 20, the VCO 10 includes BJTS 41, 42 and resistors 43-45. The BJTs 41, 42 are respectively coupled to tail current sources 46, 48. The arrangement of the BJTs 41, 42 may also enhance the performance of the VCO 10, similar to the common-emitter/emitter-followers described above with reference to the BJTs 31-34.

The resistors 43, 44 are coupled together at the common node 21. The common node 21 receives the bias signal, and communicates the bias signal to both the output nodes 18, 20. The resistors 43, 44, although not limited to a specific resistance value, should be sufficiently small in order to prevent dampening of the periodic output signal across the nodes 22, 24. In one example, the resistors 43, 44 may have resistance values of 1 kohm and provide an adequate coupling of the bias signal to the output nodes 18, 20.

The VCO 10 also includes a negative resistance component 50 for promoting the amplification and oscillation of the periodic output signal (i.e., providing energy to the tank circuits). The capacitors 52, 54 couple the negative resistance component 50 to the output nodes 18, 20, and provide isolation between the bias in associated with the negative resistance component 50 in the biasing of the varactor element. Also, because the varactor capacitance is much smaller than the capacitors 52, 54, the varactor capacitance dominates the value of the LC tank circuit capacitance. Generally speaking, the negative resistance component 50 is an active circuit which cancels losses in the tank circuits. The negative resistance components 50 should provide a closed loop gain within the VCO 10 which is greater than or equal to unity magnitude. Losses in the VCO 10 may be attributed to parasitic resistances within the diodes 26-29, the resistors 43, 44, the inductor 20, and any other active component.

Figure 2A:
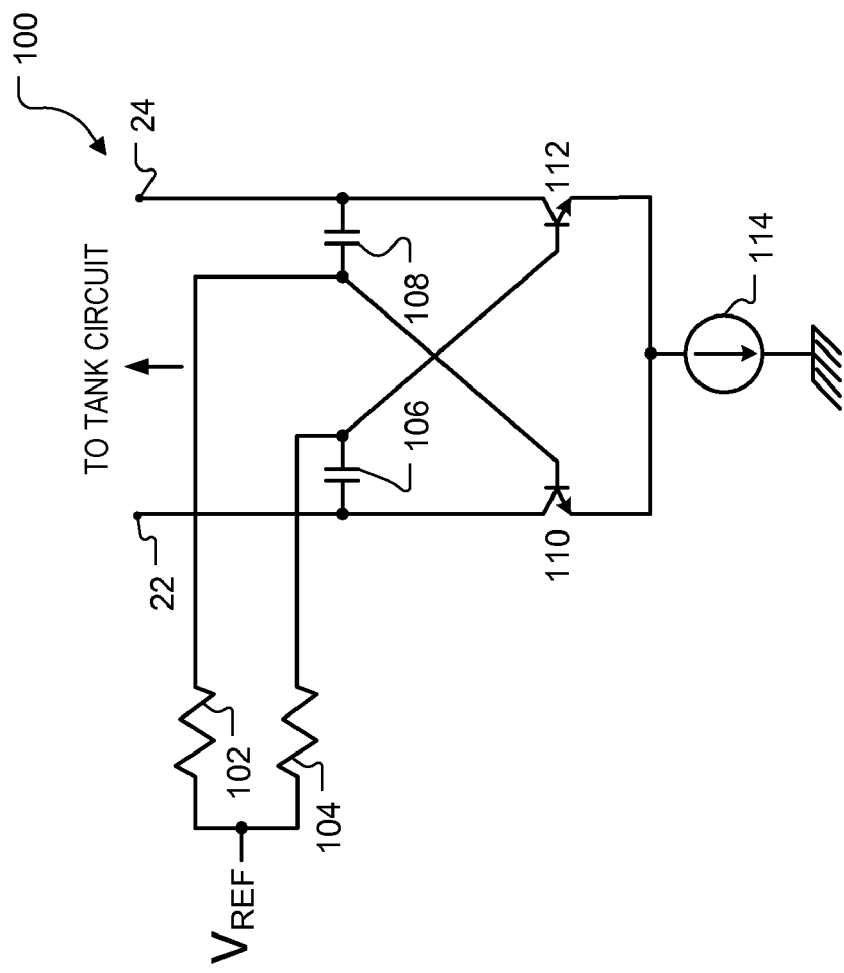
FIG. 2A is a schematic diagram of a negative resistance component, according to an example.

FIG. 2A shows a differential amplifier 100, which may be used as the negative resistance component 50. The amplifier 100 includes resistors 102, 104, capacitors 106, 108, BJTs 110, 112, and tail current source 114. The resistors 102, 104 are coupled to receive a reference signal and communicate the reference signal to the capacitors 106, 108. Both of the tank circuits provide a differential load to the amplifier 100, where the common node 21 remains at a potential associated with the bias signal. Operationally, the BJTs 110, 112 provide positive feedback to the tank circuits. As described above, the negative resistance of the amplifier should be designed to overcome all of the resistive losses of the tank circuits.

Figure 2B:
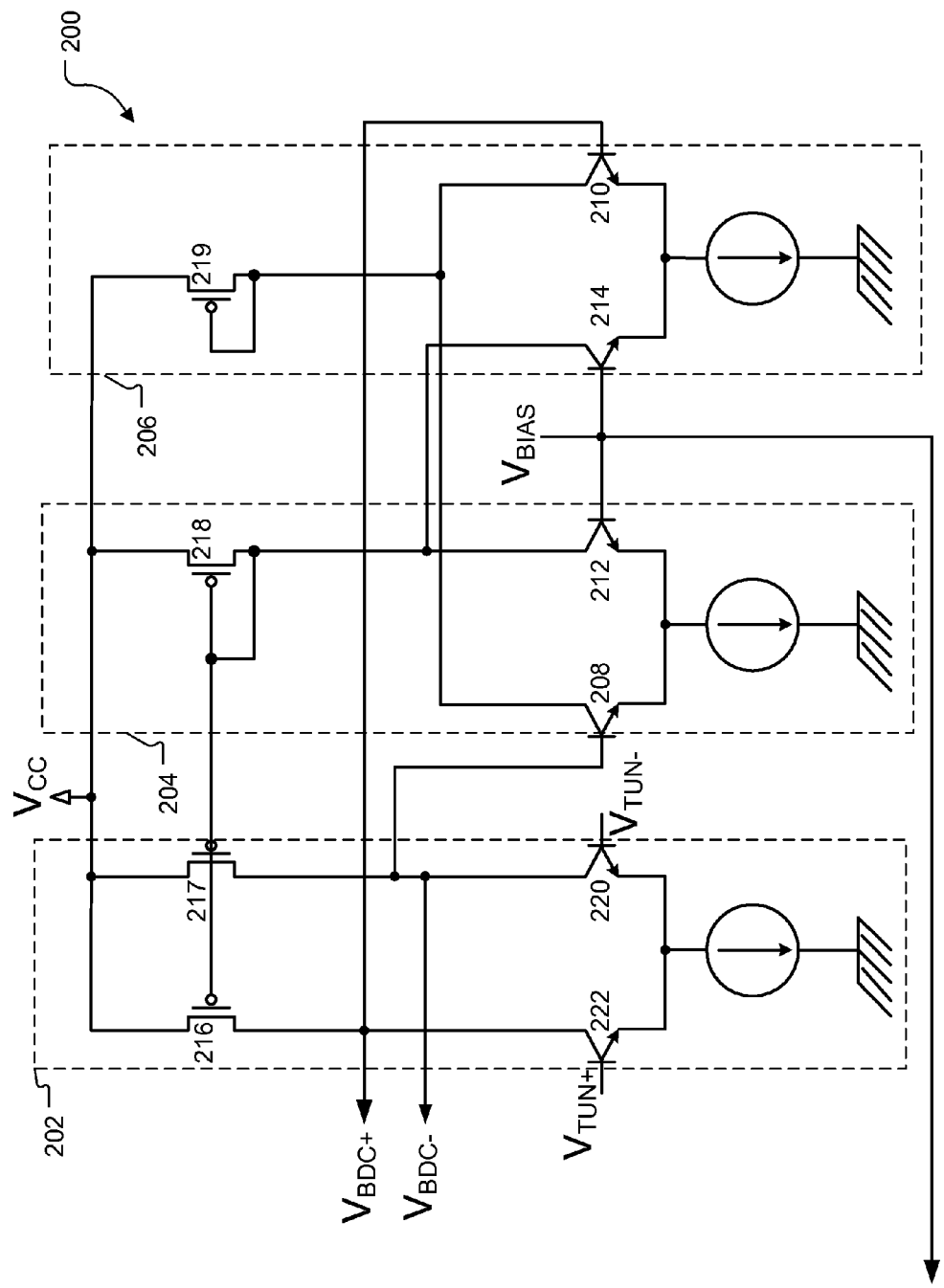
FIG. 2B is a schematic diagram of a tuning circuit, according to an example.

As described above, the bias-dependent control signal is a combination of the tuning signal and the bias signal. In a preferred embodiment, the common mode, or average, of the bias-dependent signal is substantially equal to the bias signal. FIG. 2B shows a tuning circuit 200 that may be used to generate the bias-dependent control signal. The tuning circuit 200 receives the bias signal and the tuning signal, and produces the bias-dependent control signal. The tuning circuit 200 includes a differential amplifier 202 which is coupled to receive the tuning signal ($V_{TUN+}$, $V_{TUN-}$). The tuning circuit 200 also includes a pair of differential amplifiers 204, 206 for effectively summing the bias signal with the tuning signal.

To sum the bias and tuning signals, the differential amplifiers 204, 206 are biased by both the bias-dependent control signal and the bias signal. At one end of the differential amplifiers 204, 206 are BJTs 208, 210 which are respectively coupled to the negative and positive differential ends of the bias-dependent control signal. At the other end of the common mode differential amplifiers 204, 206 are BJTs 212, 214 which are coupled to receive the bias signal.

The outputs of amplifier 202 may be altered by the tuning signal, which is applied to BJTS 220, 222. When the input signal at the BJTs 220, 222 is altered, the voltage at the input BJTs 208, 210 will likewise be altered and therefore provide feedback to the amplifiers 204, 206 via FET 218. The overall effect is that the common mode feedback amplifiers 204, 206 attempt to drive the average of the outputs of differential amplifier 202 to be equal to $V_{CC}$ minus $V_{BG}$, which is the value of the bias signal. The feedback between the differential amplifier 202 and the amplifiers 204, 206 allows the tuning signal to be centered around the bias signal. Note also that if the bias signal changes (via a common mode noise voltage, for instance), the amplifiers 204, 206 provide feedback to the amplifier 202 via field effect transistors (FETs) 216-219, influencing the bias-dependent control signal. It should be understood, however, that the tuning circuit 200 is an example only, and other tuning circuits could be used to combine the tuning signal and the bias signal into the bias-dependent control signal. In particular, the common mode of the tuning signal may be some multiple or some proportional factor of the bias signal.

Demonstrating the advantages of the bias-dependent control signal are the FIGS. 3A and 3B, which are plots showing capacitance across the varactor element 12. FIGS. 3A and 3B show $C_1$, the capacitance across the input node to the output nodes all and $C_2$, the capacitance across the output nodes to the input node. $C_{EQV}$ is the series combination of $C_1$ and $C_2$.

FIG. 3A shows a plot of the general behavior of varactor biased according to the techniques of the prior art. The effect of a change in the bias on $C_1$, $C_2$, and $C_{EQV}$, if the tuning signal were used to drive the input nodes (in lieu of the bias-dependent control signal) are plotted for a fixed tuning voltage input. As FIG. 3A demonstrates, as the bias signal varies, $C_1$ and $C_2$ vary, causing $C_{EQV}$ to vary. Consequently, the periodic output signal of the VCO 10 may be deleteriously impacted by this varying capacitance. Variation in $C_{EQV}$ may produce jitter and delayed convergence, resulting in unreliable output signals. Moreover, increases in $C_{EQV}$ may likewise increase the capacitance of the tank circuits, which may reduce the tuning speed of the VCO 10. Generally speaking, it is difficult to completely remove noise influence from the bias signal. For example, common mode voltage noise may typically cause the bias signal to vary in DC offset during normal operation.

Because noise cannot be removed completely from the tuning signal, it is desirable for the tuning voltage to be centered around the bias signal. FIG. 3B reflects the behavior of $C_1$, $C_2$, and $C_{EQV}$ using the bias-dependent control signal to drive the input nodes 14, 16. FIG. 3B shows that when the tuning signal is centered around the bias signal, $C_{EQV}$ remains substantially constant. In operation, when the bias voltage shifts, the bias-dependent control voltage shifts, preventing an asymmetric capacitance variation to occur across the varactor element (i.e., $C_1$ remains approximately equal to $C_2$). Furthermore, any change in the bias signal is filtered out, and the tuning signal is allowed to establish the voltage drops across each of the diodes 26-29 without the bias signal influence.

The bias signal, in general, should be designed to be a stable predictable value. The bias signal may be generated by a variety of bias circuits. For example, a bandgap reference circuit, which uses the intrinsic voltage of a semiconductor bandgap, may generate the bias signal. Typically, bandgap reference circuits provide a predictable output signal that scales with temperature, allowing the VCO to compensate for active currents (through FETs or BJTS) that may increase with temperature. Other bias circuits, however, are possible.

Figure 4:
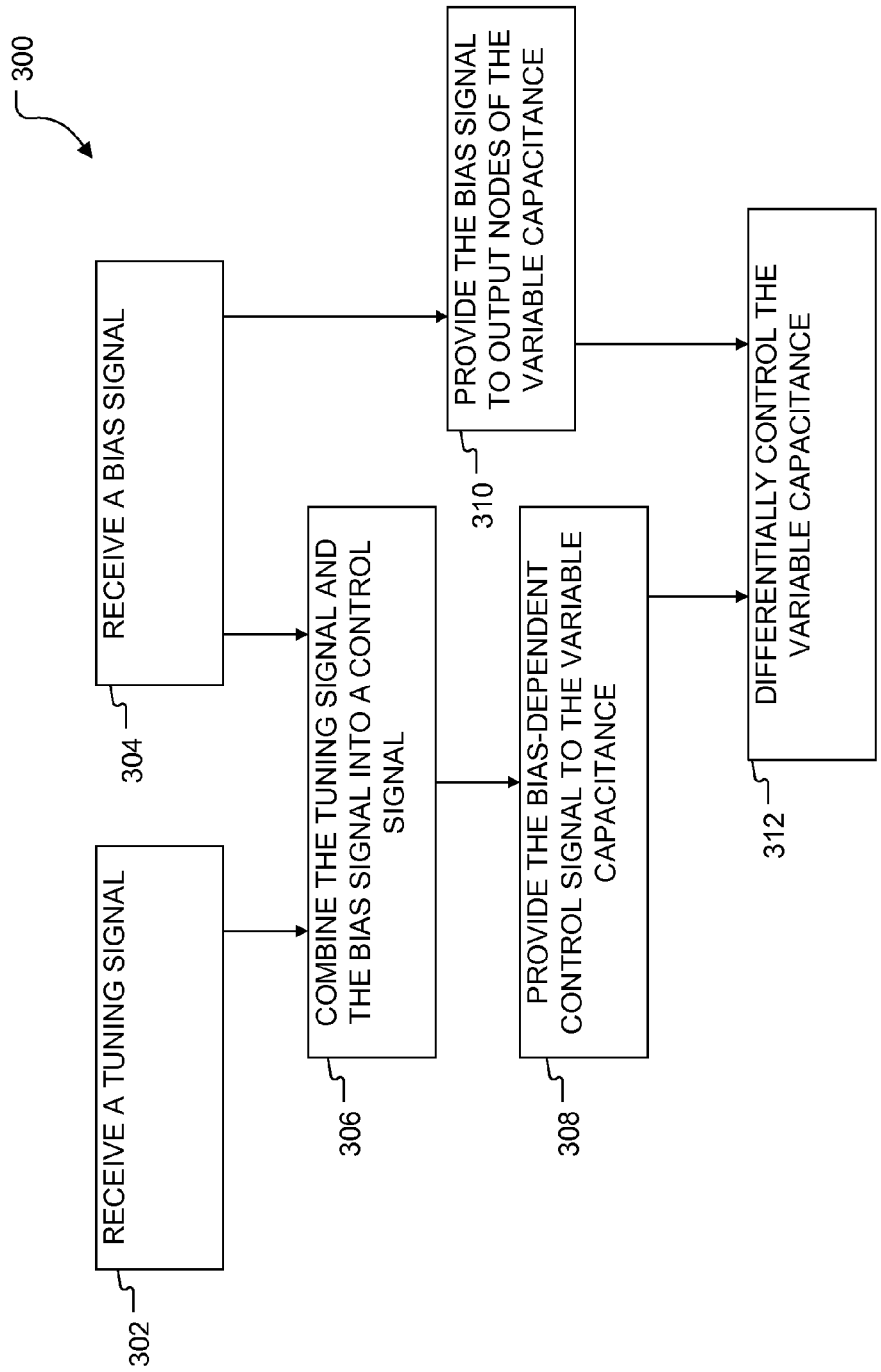
FIG. 4 is a flow diagram depicting a method of operating a VCO.

FIG. 4 is a block diagram of a method 300, which generally describes operation of a VCO using the bias-dependent control and the bias signals. At blocks 302, 304 a VCO receives a tuning signal and a bias signal. The tuning signal, in one example, may be a differential signal, which communicates current or voltage pulses intended for adjusting the capacitance value of a variable capacitance. The variable capacitance may be located within an oscillator circuit, such as the VCO described above. The bias signal, also described above, may be generated by bias circuit.

At block 306 in the method 300, the tuning and bias signal are combined into a bias-dependent control signal. At block 308, the bias-dependent control signal is provided to the variable capacitance. For instance, the bias-dependent may be provided to varactor diode inputs. At block 310, the bias signal is also provided to the variable capacitance. The bias signal and the bias-dependent controls signal are then used to differentially control the variable capacitance, shown at block 312. In effect, the method 300 may be used to fully differentially control a VCO. Such a differential control prevents the bias signal from causing the capacitance value of the variable capacitance from drifting.

A variety of examples have been described above. More generally, those skilled in the art will understand that changes and modifications may be made to these examples without departing from the true scope and spirit of the present invention, which is defined by the claims. Thus, for example, a VCO should not be limited to the capacitance, inductive, or resistance values of any of the described circuit elements and components described above. Any of the above circuit elements and components may be modified to achieve a desired periodic output signal. In one example, the described VCO may be capable of producing a periodic output signal with a frequency of up to about 10 GHz having a tuning range of about 1 GHz. If the maximum voltage drop across the varactor element 12 is about 1.4 V (0.7 V for each diode), the gain of the VCO 10 is about 1 GHz/1.4 V. Other examples operating characteristics are possible.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A voltage controlled oscillator, comprising:
  a varactor element having two varactor input nodes and two varactor output nodes, wherein an input signal on the varactor input nodes alters a capacitance of the varactor element at the varactor output nodes;
  an inductor element intercoupled with the varactor output nodes;
  a bias circuit coupled to the varactor element for generating a bias signal at the varactor output nodes; and
  a tuning circuit providing a differential bias-dependent control signal at a tuning output, wherein the tuning output is coupled to the varactor input nodes, and wherein the tuning circuit combines a differential tuning signal with the bias signal to generate the differential bias-dependent control signal and provides the differential bias-dependent control signal to the varactor input nodes.

2. The apparatus of claim 1 wherein the bias-dependent control signal causes the varactor element to provide& a capacitance substantially independent of the bias voltage.

3. The apparatus of claim 1 wherein the common mode voltage of the differential bias-dependent control signal is substantially equal to the bias signal.

4. The apparatus of claim 1, wherein the varactor element comprises four varactor diodes.

5. The apparatus of claim 1, wherein the tuning circuit comprises a differential amplifier.

6. The apparatus of claim 5, wherein the differential amplifier is coupled to the varactor input nodes via low-impedance driver circuitry.

7. The apparatus of claim 1, further comprising:
a pair of resistive elements intercoupled with the varactor output nodes, wherein the resistive elements are coupled together at a common node;
a pair of capacitive elements intercoupled with the varactor output nodes; and
a negative resistance component intercoupled with the varactor output nodes for promoting amplification within the VCO.

8. The apparatus of claim 7, wherein the bias circuit is coupled to the common node.

9. The apparatus of claim 6, wherein the bias circuit is coupled to the common node via low-impedance driver circuitry.

10. The apparatus of claim 1, wherein the bias circuit is a band-gap reference circuit.

11. A voltage controlled oscillator, comprising:
a tank circuit means comprising an inductor means and a variable capacitance means, the variable capacitance means having two differential control nodes, and two differential output nodes;
biasing circuit means for biasing the variable capacitance means with a bias signal; and
a tuning circuit means for generating a differential bias-dependent control signal by combining the bias signal with a tuning signal and providing the differential bias-dependent tuning signal to the two differential control nodes.

12. The apparatus of claim 11, wherein the variable capacitance means is a differential varactor.

13. The apparatus of claim 11, wherein the biasing circuit means comprise a band gap reference circuit.

14. The apparatus of claim 13, wherein the tuning circuit means comprise a differential amplifier, wherein the input tuning signal is a differential signal.

15. The apparatus of claim 14, wherein the tuning circuit means is coupled to a pair of differential amplifiers, and wherein the pair of differential amplifiers is coupled to receive the bias signal.

16. The apparatus of claim 11, wherein the bias signal is applied to the differential output nodes via two resistors.

17. A method of tuning a voltage controlled oscillator comprising the steps of:
receiving a tuning signal;
receiving a bias signal;
generating a differential bias-dependent control signal in response to the tuning signal and the bias signal;
providing the bias signal to two nodes of a variable capacitance in an oscillator circuit; and
providing the differential bias-dependent control signal to two control nodes of the variable capacitance.

18. The method of claim 17, wherein the tuning signal is a differential signal and the differential bias-dependent control signal has a common-mode voltage substantially equal to the bias signal.

19. The method of claim 17 wherein the variable capacitance is substantially independent of the bias signal.

20. The method of claim 17, wherein the bias signal is generated from a bandgap reference voltage.

21. The method of claim 17, wherein the bias signal is provided to the two nodes of the variable capacitance via two resistive elements.

22. The method of claim 17, wherein the bias signal and the differential bias-dependent control signal are each applied to the variable capacitance via low-impedance driver circuitry.

23. A voltage controlled oscillator, comprising:
a varactor element having two varactor input nodes and two varactor output nodes, wherein an input signal on the varactor input nodes alters a capacitance of the varactor element at the varactor output nodes;
an inductor element intercoupled with the varactor output nodes;
a bias circuit coupled to the varactor element for generating a bias signal at the varactor output nodes; and
a tuning circuit providing a differential bias-dependent control signal to the varactor, wherein the tuning circuit combines a differential tuning signal with the bias signal to generate the differential bias-dependent control signal, and wherein the common mode voltage of the differential bias-dependent control signal is substantially equal to the bias signal.

24. The apparatus of claim 23 wherein the differential bias-dependent control signal causes the varactor element to provide a capacitance substantially independent of the bias voltage.

25. The apparatus of claim 23, wherein the varactor element comprises four varactor diodes.

26. The apparatus of claim 23, wherein the tuning circuit comprises a differential amplifier.

27. The apparatus of claim 26, wherein the differential amplifier is coupled to the varactor input nodes via low-impedance driver circuitry.

28. The apparatus of claim 23, wherein the bias circuit is a band-gap reference circuit.

29. A method of tuning a voltage controlled oscillator comprising the steps of:
receiving a tuning signal;
receiving a bias signal;
generating a differential bias-dependent control signal in response to the tuning signal and the bias signal, wherein the common mode voltage of the differential bias-dependent control signal is substantially equal to the bias signal;
providing the bias signal to two nodes of a variable capacitance in an oscillator circuit; and
providing the differential bias-dependent control signal to two control nodes of the variable capacitance.

30. The method of claim 29, wherein the bias signal is generated from a bandgap reference voltage.

31. The method of claim 29, wherein the bias signal and the bias-dependent control signal are each applied to the variable capacitance via low-impedance driver circuitry.

* * * * *